(12) United States Patent
Xiao

(10) Patent No.: US 10,043,671 B2
(45) Date of Patent: Aug. 7, 2018

(54) TRANSISTOR AND FABRICATION METHOD THEREOF

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/097,627

(22) Filed: Apr. 13, 2016

(65) Prior Publication Data

US 2016/0308043 A1 Oct. 20, 2016

(30) Foreign Application Priority Data

Apr. 16, 2015 (CN) .......................... 2015 1 0181550

(51) Int. Cl.
| | |
|---|---|
| *H01L 29/78* | (2006.01) |
| *H01L 21/285* | (2006.01) |
| *H01L 29/66* | (2006.01) |
| *H01L 29/16* | (2006.01) |
| *H01L 29/20* | (2006.01) |

(52) U.S. Cl.
CPC .... *H01L 21/28556* (2013.01); *H01L 21/2855* (2013.01); *H01L 29/66666* (2013.01); *H01L 29/7828* (2013.01); *H01L 29/1608* (2013.01); *H01L 29/2003* (2013.01)

(58) Field of Classification Search
CPC ................................................. H01L 29/7813
See application file for complete search history.

(56) References Cited

U.S. PATENT DOCUMENTS

| | | | |
|---|---|---|---|
| 2010/0283083 A1* | 11/2010 | Niiyama ............ | H01L 29/7835 257/192 |
| 2012/0161208 A1* | 6/2012 | Veliadis ............. | H01L 29/1608 257/265 |
| 2012/0199889 A1* | 8/2012 | Miyamoto ............ | H01L 29/201 257/288 |
| 2013/0020586 A1* | 1/2013 | Miura ................. | H01L 29/0615 257/77 |
| 2013/0234240 A1* | 9/2013 | Moon ................. | H01L 29/7827 257/329 |

(Continued)

*Primary Examiner* — Peniel M Gumedzoe
*Assistant Examiner* — Christopher Johnson
(74) *Attorney, Agent, or Firm* — Anova Law Group, PLLC

(57) ABSTRACT

A junction-less transistor structure and fabrication method thereof are provided. The method includes providing a semiconductor substrate; and forming an epitaxial layer having a first surface and a second surface on the semiconductor substrate. The method also includes forming a plurality of trenches in the epitaxial layer from the first surface thereof; and forming a gate dielectric layer on side and bottom surfaces of the plurality of trenches. Further, the method includes forming a gate electrode layer on the gate dielectric layer and in the plurality of trenches; and forming an insulation layer on the gate electrode layer. Further, the method also includes forming a drain electrode layer on the first surface of the epitaxial layer; removing the semiconductor substrate; and forming a source electrode layer on the second surface of the epitaxial layer.

11 Claims, 6 Drawing Sheets

(56) References Cited

U.S. PATENT DOCUMENTS

2014/0361362 A1* 12/2014 Hsu .................... H01L 29/7813
                                                    257/330
2016/0104532 A1*  4/2016 Petti ................... G11C 15/046
                                                    365/49.17

* cited by examiner

US 10,043,671 B2

TRANSISTOR AND FABRICATION METHOD THEREOF

CROSS-REFERENCES TO RELATED APPLICATIONS

This application claims the priority of Chinese patent application No. 201510181550.2, filed on Apr. 16, 2015, the entirety of which is incorporated herein by reference.

FIELD OF THE INVENTION

The present invention generally relates to the field of semiconductor manufacturing technology and, more particularly, relates to transistors and fabrication processes thereof.

BACKGROUND

In a field-effect transistor (FET), the doping type and the doping concentration of the source and drain regions are different from the doping type and doping concentration of the channel region. Thus, PN junctions are formed between the source region and the channel region, and between the drain region and the channel region. By applying bias voltages on the source region, the drain and the channel region, the FET is turned on, or turned off. For power electronic devices, vertical junction FETs (JFETs) are usually used as switching devices.

However, with the continuous development of semiconductor technology, the technical node has gradually decreased; and the critical dimension of the semiconductor device has also become smaller and smaller. The threshold voltage-drift effect and the increase of the leakage-current have affected the performance of the power semiconductor devices more and more. Thus, the JFETs are unable to satisfy the requirements of power semiconductor devices; and the performance of the power semiconductor devices is significantly affected.

The disclosed device structures and methods are directed to solve one or more problems set forth above and other problems.

BRIEF SUMMARY OF THE DISCLOSURE

One aspect of the present disclosure includes a method for fabricating a junction-less transistor structure. The method includes providing a semiconductor substrate; and forming an epitaxial layer having a first surface and a second surface on the semiconductor substrate. The method also includes forming a plurality of trenches in the epitaxial layer from the first surface thereof; and forming a gate dielectric layer on side and bottom surfaces of the plurality of trenches. Further, the method includes forming a gate electrode layer on the gate dielectric layer and in the plurality of trenches; and forming an insulation layer on the gate electrode layer. Further, the method also includes forming a drain electrode layer on the first surface of the epitaxial layer; removing the semiconductor substrate; and forming a source electrode layer on the second surface of the epitaxial layer.

Another aspect of the present disclosure includes a junction-less transistor structure. The junction-less transistor structure includes an epitaxial layer having a first surface and a second surface; and a gate dielectric layer formed in the first surface of the epitaxial layer. The junction-less transistor also includes a gate electrode layer formed on the gate dielectric layer, wherein the gate dielectric layer is formed on side and bottom surfaces of a plurality of trenches that are formed in the epitaxial layer from the first surface thereof; and an insulation layer formed on the gate electrode layer. Further, the junction-less transistor structure includes a source electrode layer and a drain electrode layer formed on the first surface and the second surface of the epitaxial layer, respectively.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As described previously, the vertical JFETs are unable to meet the requirements of the power semiconductor devices when the technical node is further reduced. One reason may be the abrupt doping change when the source region and the channel region form a PN junction and the drain region and the channel region form a PN junction. Such an abrupt doping change may cause the threshold voltage drift; and increase the leakage-current. According to the disclosed embodiments, the performance of the power semiconductor device may be improved by using junction-less transistors. The doping types of the source region, the drain region and the channel region of the junction less transistor are identical; and no PN junctions are formed. Thus, the threshold voltage drift and the leakage current increasing issues caused by an abrupt doping change may be avoided. Further, the junction-less transistor may be able to inhibit the short-channel effect; and may be able to function properly when the critical dimension is in a few nanometer range. When the junction-less transistor is applied in a power device, the performance of the power device may be further improved.

Figure 12:
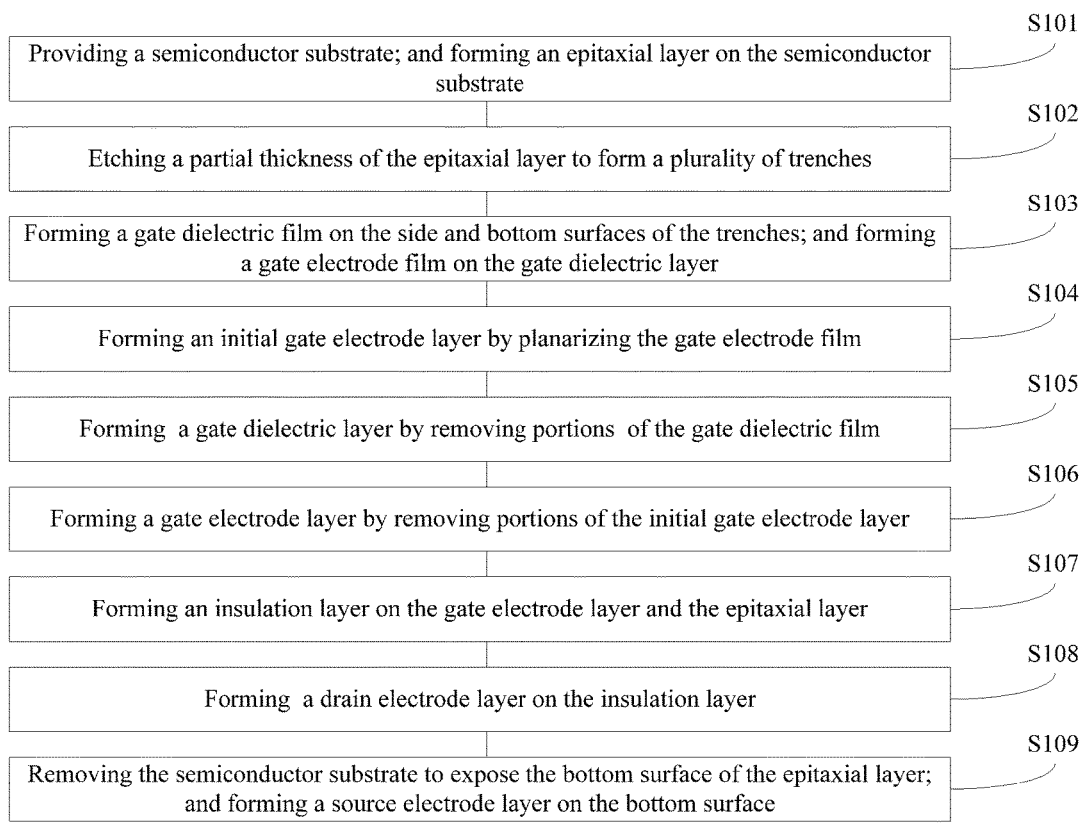
FIG. 12 illustrates an exemplary fabrication process of a junction-less transistor structure consistent with the disclosed embodiments.

FIG. 12 illustrates an exemplary fabrication process of a junction-less transistor consistent with the disclosed embodiments; and FIGS. 1-9 illustrate semiconductor structures corresponding to certain stages of the exemplary fabrication process.

Figure 1:
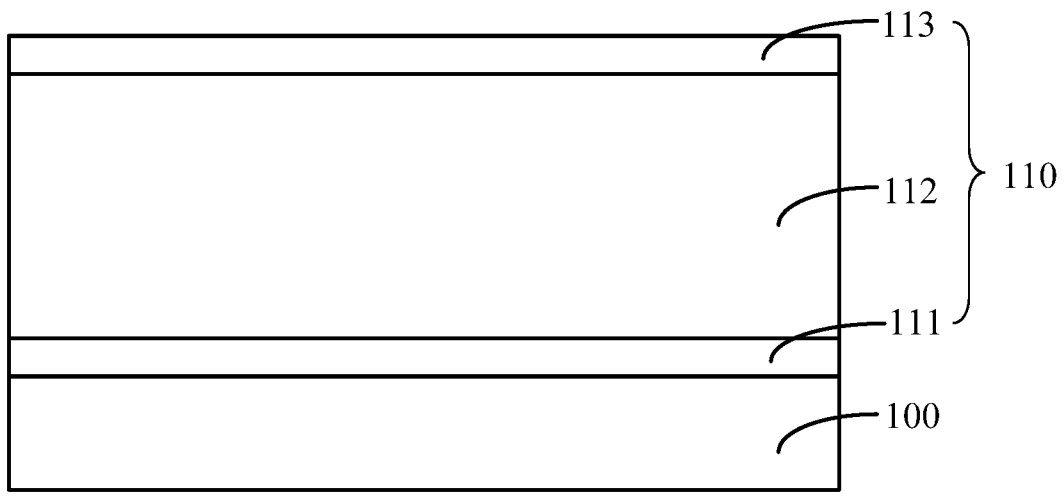
FIGS. 1-9 illustrate semiconductor structures corresponding to certain stages of an exemplary fabrication process of a transistor structure consistent with the disclosed embodiments.

As shown in FIG. 12, at the beginning of fabrication process, a semiconductor substrate with certain structures is provided (S101). FIG. 1 illustrates a corresponding semiconductor structure.

As shown in FIG. 1, a semiconductor substrate 100 is provided. An epitaxial layer 110 may be formed on the top surface of the semiconductor substrate 100. The epitaxial layer 110 may have a first surface and a second surface opposing the first surface. In one embodiment, the first surface is the exposed top surface; and the second surface is the surface contacting with the top surface of the semiconductor substrate 100. Further, the epitaxial layer 110 may be doped with a first type of doping ions.

The semiconductor substrate 100 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor, or a combination thereof. The semiconductor substrate 100 provides a base for subsequent devices and processes. In one embodiment, for illustrative purposes, the semiconductor substrate 100 is made of single crystal silicon.

The epitaxial layer 110 may be used to subsequently form junction-less transistors. In one embodiment, as show in FIG. 1, the epitaxial layer 110 may be a multiple-layer stacked structure, including a first epitaxial layer 111 formed on the top surface of the semiconductor substrate 100; a second epitaxial layer 112 formed on the first epitaxial layer 111; and a third epitaxial layer 113 on the second epitaxial layer 112.

The first epitaxial layer 111 may have a first doping concentration "$C_1$". The first epitaxial layer 111 may be subsequently used as a source contact layer to reduce the contact resistances between the drift regions and the source electrode layers of the junction-less transistors.

The second epitaxial layer 112 may have a second doping concentration $C_2$. The second epitaxial layer 112 may be used to subsequently form the channel regions and drift regions of the junction-less transistors.

The third epitaxial layer 113 may have a third doping concentration $C_3$. The third epitaxial layer 113 may be subsequently used as a drain contact layer to reduce the contact resistances between the drift regions and the drain electrode layers of the junction-less transistors.

The first doping concentration $C_1$ and the third doping concentration $C_3$ may be greater than second doping concentration $C_2$. The first epitaxial layer 111, the second epitaxial layer 112 and the third epitaxial layer 113 may all be doped with ions of the first doping type. The first doping type may be n-type, or p-type.

In certain other embodiments, the epitaxial layer 110 may include a single layer structure. Such a single layer structure may also be doped with the first type doping ions; and may be used to subsequently form the drift regions and the channel regions etc., of junction-less transistors.

The epitaxial layer 110 may be made of any appropriate material, such as SiC, GaN, or other wide band-gap semiconductor material, etc. The wide band-gap semiconductor material may be referred to as a third generation semiconductor material, and the band-gap ($E_g$) of such a semiconductor material may be equal to, or greater than approximately 2.3 eV.

In one embodiment, the epitaxial layer 110 is made of GaN; and the first doping type of ions is n-type. For example, GaN may be n-type doped. The epitaxial layer 110 may include the first epitaxial layer 111, the second epitaxial layer 112 and the third epitaxial layer 113 as shown in FIG. 1; and the bottom surface of the first epitaxial layer 111 may be referred to as the second surface; and the top surface of the third epitaxial layer 113 may be referred to as the first surface.

The first epitaxial layer 111 may be subsequently used as a source contact layer. The first epitaxial layer 111 may be n-type heavily doped. The first doping concentration $C_1$ of the n-type doping ions may be in a range of approximately 1e18 atom/cm$^3$-8e19 atom/cm$^3$.

The third epitaxial layer 113 may be subsequently used as the drain contact layer. The third epitaxial layer 113 may be n-type heavily doped. The third doping concentration $C_3$ of the n-type ions may be in a range of approximately 1e18 atom/cm$^3$-8e18 atom/cm$^3$.

The second epitaxial layer 112 may be n-type lightly doped. The second doping concentration $C_2$ of the n-type ions may be in a range of approximately 5e15 atom/cm$^3$-8e17 atom/cm$^3$.

In certain other embodiments, the first epitaxial layer 111 may be used as a drain contact layer; and the third epitaxial layer 113 may be used as a source contact layer. The first doping concentration $C_1$ and the third doing concentration $C_3$ may be equal, or different.

To lower the contact resistance between the drift region and the source contact layer of the junction-less transistor, and the drift region and the drain contact layer of the junction-less transistor, the thicknesses of the first epitaxial layer 111 and the third epitaxial layer 113 may have certain requirements. In one embodiment, the thickness of the first epitaxial layer 111 may be in a range of approximately 10 nm-50 nm; and the thickness of the third epitaxial layer 113 may be in a range of approximately 10 nm-50 nm. Such a thickness range may effectively reduce the contact resistance.

Further, to ensure the subsequently formed junction-less transistors to match certain process requirements, the thickness of the second epitaxial layer 112 may be in a range of approximately 10 μm-20 μm. In one embodiment, the thickness of the first epitaxial layer 111 and the thickness of the third epitaxial layer 113 are approximately 20 nm; and the thickness of the third epitaxial layer 112 is approximately 10 μm.

In one embodiment, the semiconductor substrate 100 may be subsequently removed. Thus, it may need to consider the etching selectivity between the semiconductor substrate 100 and the epitaxial layer 110. The etching selectivity may ensure to subsequently remove the semiconductor substrate 100 with a minimum damage to the epitaxial layer 110.

Figure 2:
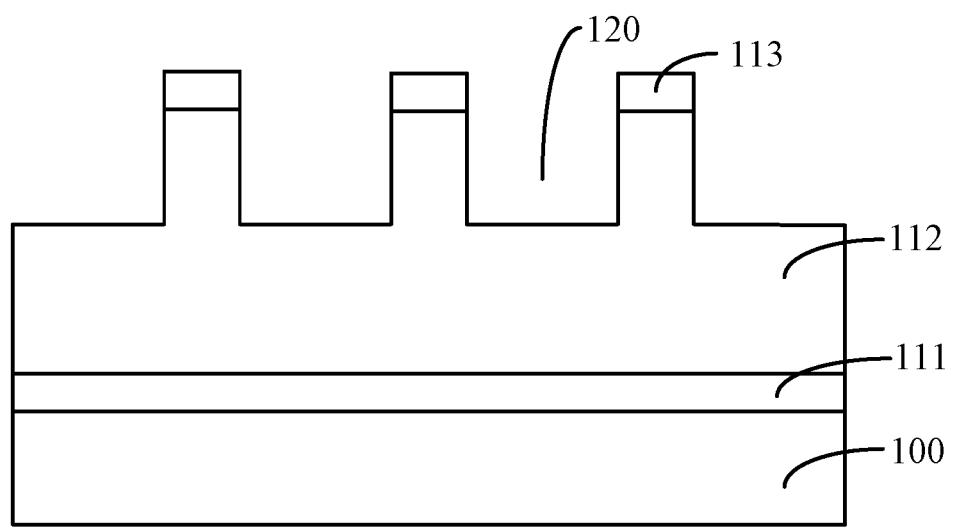

Returning to FIG. 12, after forming the epitaxial layer 110, a partial thickness of the epitaxial layer 110 may be etched (S102). FIG. 2 illustrates a corresponding semiconductor structure.

As shown in FIG. 2, a partial thickness of the epitaxial layer 110 is removed; and a plurality of trenches 120 may be formed. The plurality of trenches 120 may be used to subsequently form a dielectric material film and a gate electrode material film.

In one embodiment, the epitaxial layer 110 includes a multiple-layer structure. The third epitaxial layer 113 may be entirely etched; and a partial thickness of the second epitaxial layer 112 may be etched to form the plurality of trenches 120.

The process for forming the plurality of trenches 120 may include forming a patterned photoresist layer (not shown) on the first surface of the epitaxial layer 110 to define the position and the size of the plurality of trenches 120; and etching the epitaxial layer 110 with the partial thickness using the patterned photoresist layer as an etching mask. After forming the plurality of trenches 120, the patterned photoresist layer may be removed.

In one embodiment, the thickness of the removed portion of the epitaxial layer 110 is approximately $\frac{1}{10}$-$\frac{1}{12}$ of the total thickness of the epitaxial layer 110. That is, the depth of the plurality of trenches 120 may be approximately $\frac{1}{10}$-$\frac{1}{12}$ of the total thickness of the epitaxial layer 110. Specifically, the depth of the trenches 120 may be in a range of approximately 2 μm-5 μm.

The plurality of trenches 120 may be formed by any appropriate process, such as a dry etching process, a wet etching process, or an ion beam etching process, etc. In one embodiment, the plurality of trenches 120 are formed by an inductively coupled plasma (ICP) dry etching process. The etching gas may include $BCl_3$ and Ar, etc.

The patterned photoresist layer may be removed by any appropriate process, such as a dry etching process, a wet etching process, or an ashing process. In one embodiment, the patterned photoresist layer is removed by a dry etching process.

In one embodiment, after forming the plurality of trenches 120, the top view of the portions of the epitaxial layer 110 between adjacent trenches 120 may have a rectangular shape, a square shape, or a circular shape, etc. When the top view of the portions of the epitaxial layer 110 between the adjacent trenches 120 has the circular shape, the corner edges of the portions of the epitaxial layer 110 may be relatively smooth or otherwise rounded. Thus, the non-uniform electric field distribution at the corner edges may be avoided.

In one embodiment, the doping type of the source region, the doping type of the drain region and the doping type of the channel region of the subsequently formed transistors may be identical; and the subsequently formed transistors may not have PN junctions, i.e., may be junction-less. The "on" status and the "off" status of the junction-less transistors may be controlled by the differences of the work function of the gate electrode layers and the work function of the epitaxial layer. If the distance between adjacent trenches 120 is significantly large, it may be difficult to find an appropriate gate material to cause the channel region of the junction-less transistor to be at a depleted status when the gate voltage is 0V. If the distance between adjacent trenches 120 is substantially small, it may also be difficult to find an appropriate gate material to cause the transistor to be turned on when a gate voltage is applied. Thus, to cause the subsequently formed junction-less transistors to work properly, the distance between the adjacent trenches 120 may be in a range of approximately 1 μm-3 μm.

Figure 3:
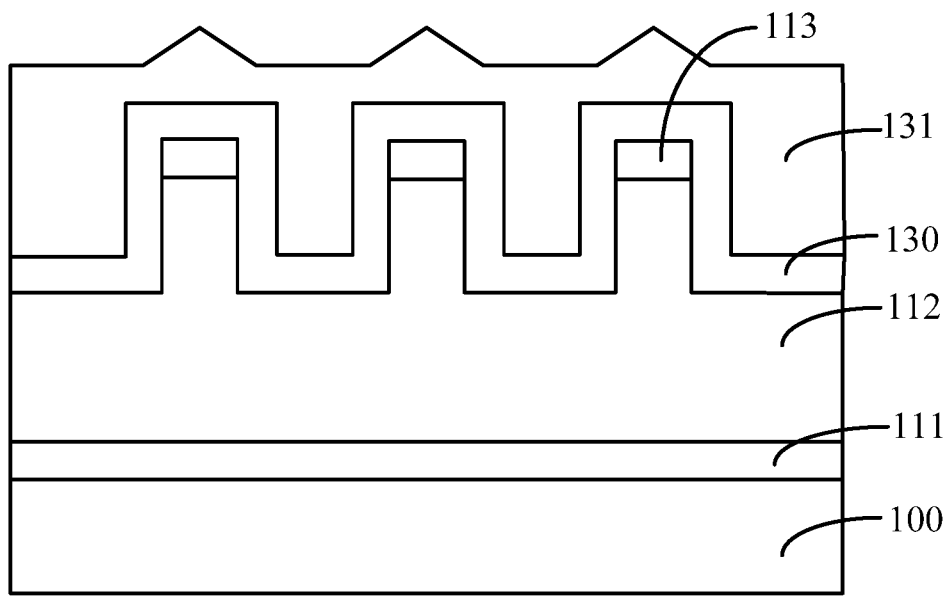

Returning to FIG. 12, after forming the plurality of trenches 120, a gate dielectric film and a gate electrode film may be formed (S103). FIG. 3 illustrates a corresponding semiconductor structure.

As shown in FIG. 3, a gate dielectric film 130 is formed on the side and bottom surfaces of the trenches 120 and the first surface of the epitaxial layer 110. Further, a gate electrode film 131 may be formed on the gate dielectric film 130. The gate dielectric film 130 may be used to subsequently form a gate dielectric layer to insulate the electrode layer from the epitaxial layer 110. The gate electrode film 131 may be used to subsequently form a gate electrode layer of the junction-less transistor structure.

The gate dielectric film 130 may be made of any appropriate material, such as $SiO_2$, $Si_3N_4$, SiON, or HfO, etc. The thickness of the gate dielectric film 130 may be in a range of approximately 2 nm-50 nm. In one embodiment, the gate dielectric film 130 is made of HfO; and the thickness of the gate dielectric film 130 is approximately 20 nm.

The gate dielectric film 130 may be formed by any appropriate process, such as a chemical vapor deposition (CVD) process, a physical vapor deposition (PVD) process, an atomic layer deposition (ALD) process, an epitaxial growth process, an atomic layer deposition (ALD) process, or a flowable CVD (FCVD) process, etc. The gate dielectric film 130 formed by such deposition processes may have desired quality.

The gate electrode film 131 may be made of any appropriate material to provide conductivity. Further, the work function difference between the gate electrode film 131 and the epitaxial layer 110 may be greater than approximately 1.5 eV. Thus, the gate electrode film 131 may be made of one or more of Ti, TiN, Ta, TaN, TiAl, Pd, Pt, W, Al, Cu, Ag, Ni, Au, Cr, or polysilicon, etc.

In one embodiment, the gate electrode film 131 is made of Cu. Cu may have a relatively large work function difference with the underneath second epitaxial layer 112. When the gate voltage applied on the subsequently formed junction-less transistor is 0V, the channel region of the transistor may be depleted; and the transistor may be turned off. When the gate voltage applied on the subsequently formed junction-less transistor is equal to, or greater than the turn-on voltage, the depletion layer may be connected; and the junction-less transistor may be turned on.

Various processes may be used to form the gate electrode film 131, such as an epitaxial deposition process, an ALD process, or a gas epitaxial deposition process, etc. The gate electrode film 131 formed by such deposition processes may have desired quality.

In certain other embodiments, a work function film may be formed between the gate dielectric film 130 and the gate electrode film 131. The work function film may be used to adjust the work function of the junction-less transistors.

Figure 4:
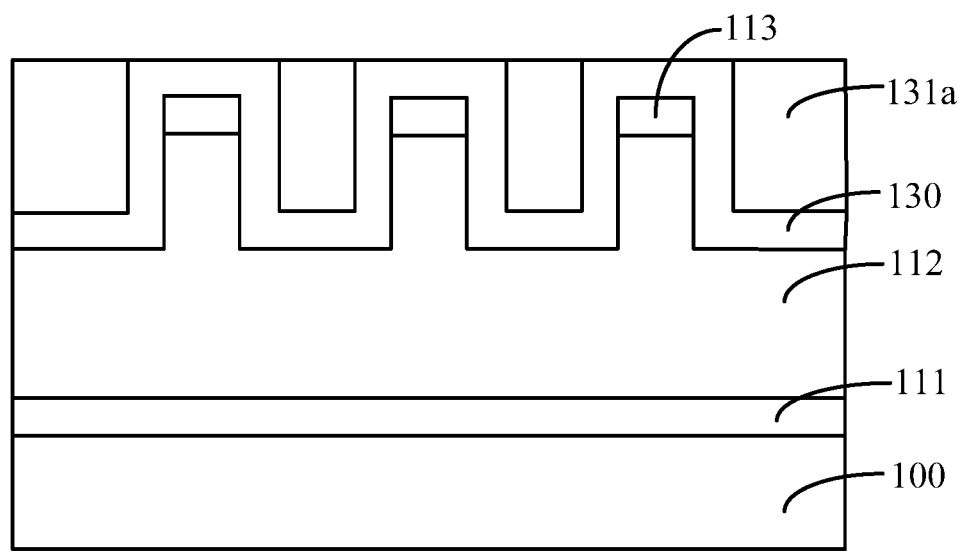

Returning to FIG. 12, after forming the gate electrode film 131, an initial electrode layer may be formed (S104). FIG. 4 illustrates a corresponding semiconductor structure.

As shown in FIG. 4, an initial gate electrode layer 131a is formed. The initial gate electrode layer 131a may be formed by planarizing the gate electrode film 131 until the surface of the gate dielectric film 130 is exposed.

The gate electrode film 131 may be planarized by any appropriate process, such as a chemical mechanical polishing (CMP) process, or an etching process, etc. When the portions of the gate dielectric film 130 between adjacent trenches 120 are exposed, the planarization process may be stopped.

Figure 5:
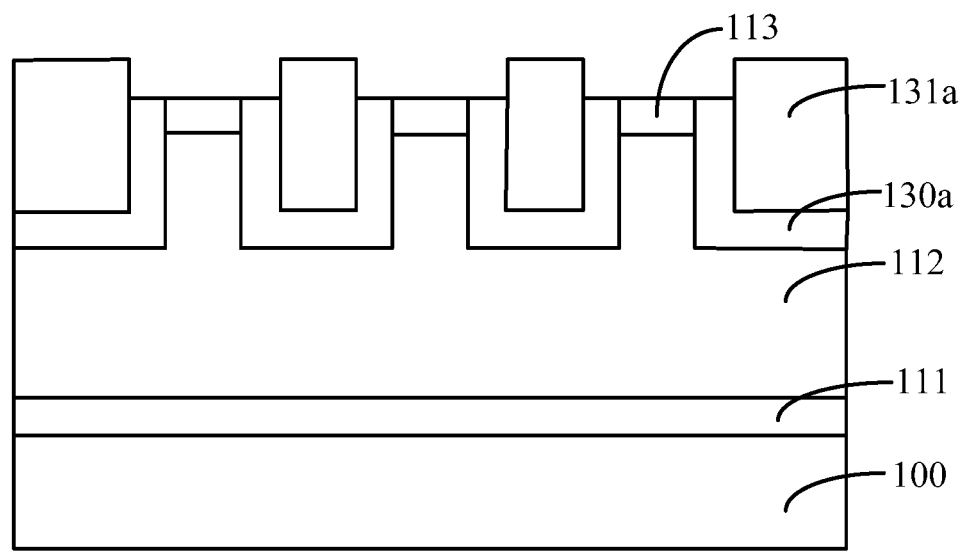

Returning to FIG. 12, after forming the initial gate electrode layer 131a, a gate dielectric layer may be formed (S105). FIG. 5 illustrates a corresponding semiconductor structure.

As shown in FIG. 5, a gate dielectric layer 130a is formed. The gate dielectric layer 130a may be formed by removing the exposed portions of the gate dielectric layer 130 until the portions of the epitaxial layer 110 between adjacent trenches 120 are exposed. That is, in one embodiment, the portions of the third epitaxial layer 113 are exposed.

The gate dielectric layer 130a may be used to subsequently insulate the subsequently formed gate electrode layer and the epitaxial layer 110. The gate dielectric layer 130a may be formed by any appropriate process, such as a dry etching process, or a wet etching process, etc.

Figure 6:
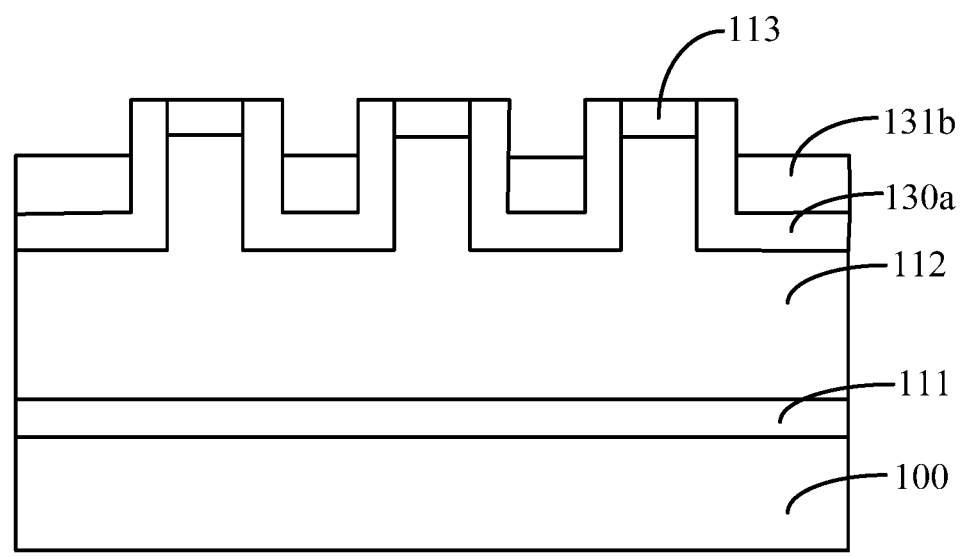

Returning to FIG. 12, after forming the gate dielectric layer 130a, a gate electrode layer may be formed (S106). FIG. 6 illustrates a corresponding semiconductor structure.

As shown in FIG. 6, a gate electrode layer 131b is formed. The gate electrode layer 131b may be formed by removing a partial thickness of the initial gate electrode layer 131a. The top surface of the gate electrode layer 131b may be lower than the surfaces of the portions of the epitaxial layer 110 between adjacent trenches 120. In one embodiment, the top surface of the gate electrode layer 131b is lower than the top surfaces of the portions of the third epitaxial layer 113 between the adjacent trenches 120.

Removing the partial thickness of the initial gate electrode layer 131a may facilitate the subsequent formation of an insulation layer. The partial thickness of the initial gate electrode layer 131a may be removed by any appropriate process, such as a dry etching process, or a wet etching process, etc. To cause the subsequently formed insulation layer to have a desire insulation performance, the partial thickness, i.e., the thickness of the removed initial gate electrode layer 131a, may be approximately 5%-20% of the depth of the trenches 120.

The gate electrode layer 131b may be used to form the gate electrode of the junction-less transistor. The gate electrode layer 131b may be made of a material identical to that of the gate electrode film 131. The work function difference between the gate electrode layer 131b and the epitaxial layer 110 may be relatively large. Thus, the gate electrode layer 131b may be made of one or more of Ti, TiN, Ta, TaN, W, Al, Cu, Ag, Ni, Au, Cr, and polysilicon. In one embodiment, the thickness of the gate electrode layer 131b may be approximately 80%-95% of the depth of the trenches 120.

Figure 7:
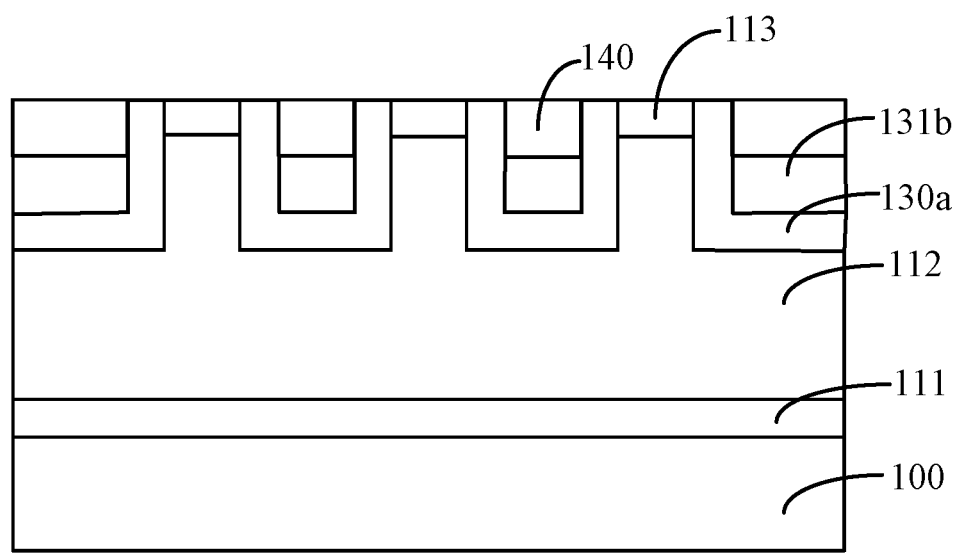

Returning to FIG. 12, after forming the gate electrode layer 131b, an insulation layer may be formed (S107). FIG. 7 illustrates a corresponding semiconductor structure.

As shown in FIG. 7, an insulation layer 140 is formed on the gate electrode layer 131b. The insulation layer 140 may also fill the trenches 120 (referring to FIG. 2). Further, the top surface of the insulation layer 140 may level with the top surface of the epitaxial layer 110. In one embodiment, the top surface of the insulation layer 140 may level with the top surface of the third epitaxial layer 113 as shown in FIG. 7.

The insulation layer 140 may be used to insulate the gate electrode layer 131b and the subsequently formed drain electrode layer. The insulation layer 140 may also be used to insulate the gate electrode layer 131b and the subsequently formed source electrode layer.

The insulation layer 140 may be made of any appropriate material, such as silicon oxide, silicon nitride, or silicon oxynitride, etc. In one embodiment, the top surface of the insulation layer 140 levels with the top surface of the third epitaxial layer 113; and is used to insulate the gate electrode layer 131b from the subsequently formed drain electrode layer. Thus, the insulation layer 140 may be made of silicon oxide.

Various processes may be used to form the insulation layer 140, such as a CVD process, or a PVD process, etc. The thickness of the insulation layer 140 may be identical to the thickness of the removed portion of the initial gate electrode layer 131a. That is, the thickness of the insulation layer 140 may be in a range of approximately 50 nm-500 nm. Such a thickness of the insulation layer 140 may have a desired insulation effect.

Figure 8:
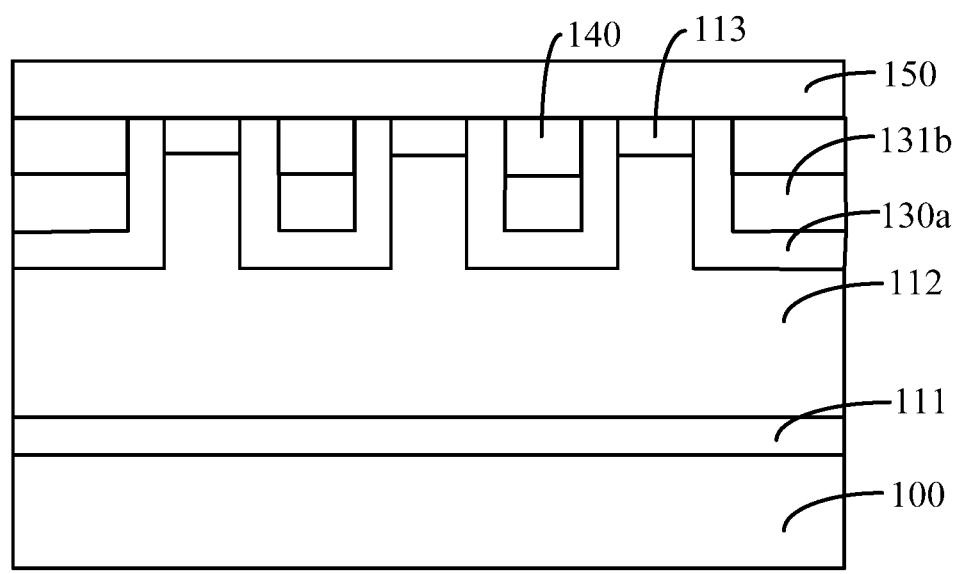

Returning to FIG. 12, after forming the insulation layer 140, a drain electrode layer may be formed (S108). FIG. 8 illustrates a corresponding semiconductor structure.

As shown in FIG. 8, a drain electrode layer 150 is formed. The drain electrode layer 150 may cover the insulation layer 140, the gate dielectric layer 130a, and the portions of the epitaxial layer 110 between adjacent trenches 120. In one embodiment, the drain electrode layer 150 covers the portions of the epitaxial layer 110 between adjacent trenches 120. The drain electrode layer 150 may be used to subsequently form the drain electrode of the junction-less transistor.

The drain electrode layer 150 may be made of any appropriate conductive material, such as Cu, Al, Au, or W, etc. Various processes may be used to form the drain electrode layer 150, such as a PVD process, an e-beam evaporation process, a sputtering process, a metal-organic CVD (MOCVD) process, or an ALD process, etc. The drain electrode layer 150 formed by such processes may have desired quality.

Figure 9:
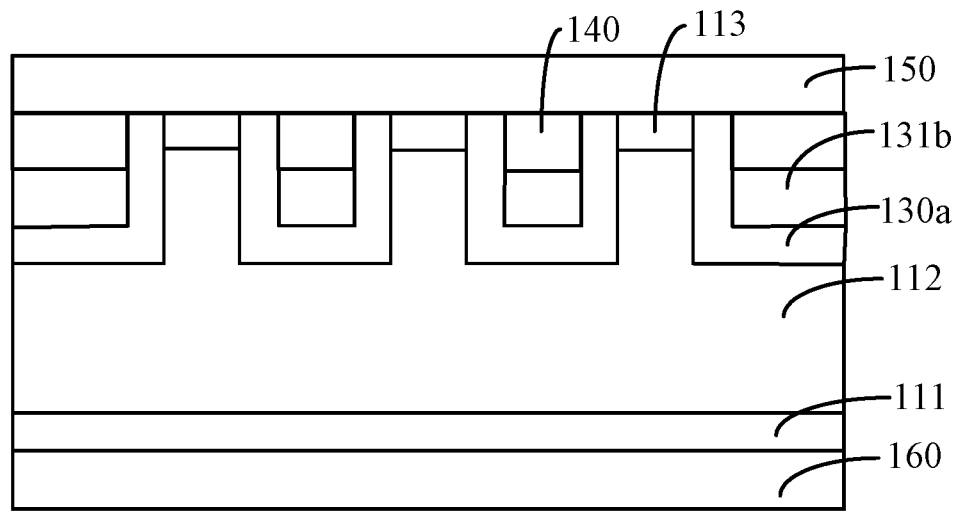

Returning to FIG. 12, after forming the drain electrode layer 150, a source electrode layer may be formed (S109). FIG. 9 illustrates a corresponding semiconductor structure.

As shown in FIG. 9, a source electrode layer 160 is formed on the bottom surface (the second surface) of the epitaxial layer 110. In one embodiment, the source electrode layer 160 is formed on the bottom surface of the first epitaxial layer 111. The source electrode layer 160 may be used to subsequently form the source electrode of the junction-less transistor. Before forming the source electrode layer 160, the semiconductor substrate 100 may be removed.

The semiconductor substrate 100 may be removed by any appropriate process, such a planarization process, or an etching process, etc. The planarization process may include a CMP process, a laser ablation process, a dry etching process, or a wet etching process, etc. After removing the semiconductor substrate 100, the source electrode layer 160 may be formed on the second surface of the epitaxial layer 110.

The source electrode layer 160 may be made of any appropriate conductive material, such as Cu, Au, Ag, Al, or W, etc. Various processes may be used to form the source electrode layer 160, such as a PVD process, an e-beam evaporation process, a sputtering process, a MOCVD process, or an ALD process, etc. The source electrode layer 160 formed by such processes may have desired quality.

Thus, as shown in FIG. 8, in one embodiment, the source electrode layer 160 is formed on the bottom surface of the first epitaxial layer 111; and the drain electrode layer 150 is formed on the top surface of the third epitaxial layer 113. In certain other embodiments, the source electrode layer 160 may be formed on the top surface of the first epitaxial layer 113; and the drain electrode layer 150 may be formed on the bottom surface of the first epitaxial layer 111, as long as the source electrode layer 160 and the drain electrode layer 150 are formed on the two surfaces of the epitaxial layer 110 respectively.

Thus, a junction-less transistor structure may be formed by the above disclosed processes and methods; and FIG. 9 illustrates a corresponding junction-less transistor structure. As shown in FIG. 9, the junction-less transistor structure may include an epitaxial layer (not labeled) having a first surface (not labeled) and a second surface, and doped with first type doping ions. The junction-less transistor structure may also include a plurality of trenches (not shown) formed in the first surface of the epitaxial layer; and a gate dielectric layer 130a formed on the side and bottom surfaces of the trenches. Further, the junction-less transistor structure may also include a gate electrode layer 130b formed on the gate dielectric layer 130a and in the trenches with top surfaces lower than a top surface of the epitaxial layer. Further, the junction-less transistor structure may also include an insulation layer 140 formed on the gate electrode layer 130b and in the trenches with a top surface level with the top surface of the epitaxial layer. Further, the junction-less transistor structure may also include a source electrode layer 150 and a drain electrode layer 160 formed on the first surface and the second surface of the epitaxial layer, respectively. The detailed structures and intermediate structures are described above with respect to the fabrication processes.

Figure 10:
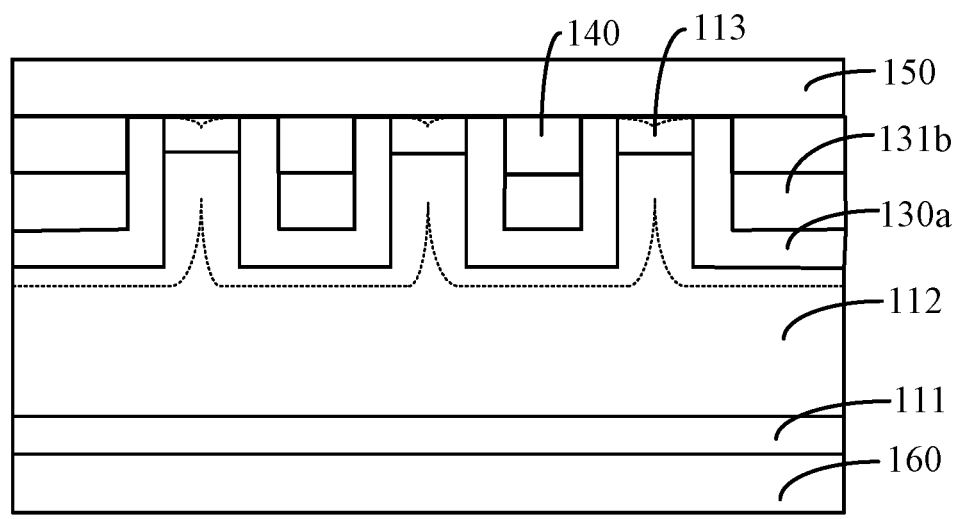
FIG. 10-11 illustrate working mechanism of an exemplary junction-less transistor structure consistent with the disclosed embodiments.
Figure 11:
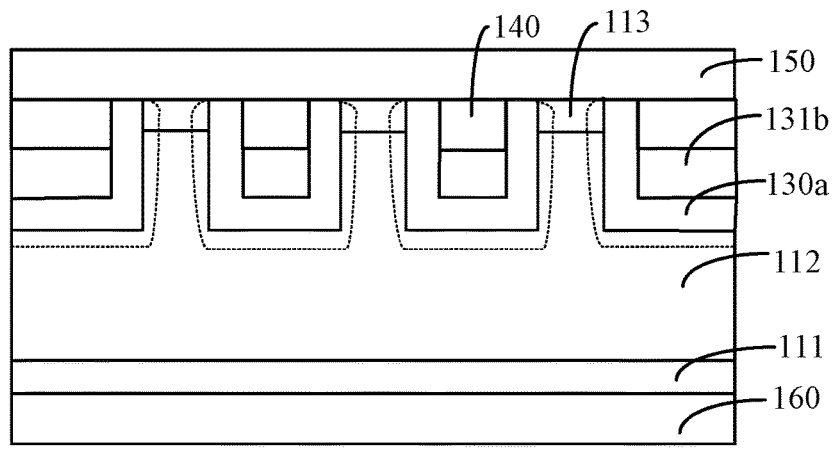

FIGS. 10-11 illustrate working mechanism of an exemplary junction-less transistor structure. FIG. 10 illustrates the working status of the junction-less transistor structure when the gate voltage is 0V; and FIG. 11 illustrates the working status of the junction-less transistor structure when the gate voltage is equal to, or greater than the turn-on voltage (greater than 0V). The dashed regions refer to the depletion regions.

As shown in FIGS. 10-11, when the gate voltage is 0V, the channel regions of the junction-less transistors may be depleted. Thus, the junction-less transistor may be at an "off" state. When the gate voltage is greater than the turn-on voltage, the depletion regions of the junction-less transistor may be connected; and the junction less transistors may be turned on. Thus, such a junction-less transistor structure may be applied in a power semiconductor device as a switch device.

Thus, according to the disclosed embodiments, during the fabrication of junction-less transistors, the doping types of in the epitaxial layers are identical. Thus, the doping process may be relatively simple; and the abrupt doping change may be avoided. Accordingly, the effect to the threshold voltage of the junction-less transistors, the leakage current issue and the short-channel effect, etc., caused by the abrupt doping changes may be prevented; and the performance of the junction-less transistor structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A transistor structure, comprising:
   an epitaxial layer having a first surface and a second surface;
   a gate dielectric layer formed in the epitaxial layer, wherein the gate dielectric layer is formed on side and bottom surfaces of a plurality of trenches that are formed in the epitaxial layer from the first surface thereof;
   a gate electrode layer formed on the gate dielectric layer;
   an insulation layer formed on the gate electrode layer, wherein a top surface of the insulation layer is coplanar with a top surface of the epitaxial layer; and
   a source electrode layer and a drain electrode layer formed on the first surface and the second surface of the epitaxial layer, respectively, wherein the drain electrode layer is formed on the top surface of the epitaxial layer and the top surface of the insulation layer; the epitaxial layer, the source electrode layer and the drain electrode layer have a same doping type, and no PN junction is formed between the source electrode layer and the drain electrode layer through the epitaxial layer.

2. The transistor structure according to claim 1, wherein the epitaxial layer further comprises:
   a first epitaxial layer with a first doping concentration formed on a semiconductor substrate;
   a second epitaxial layer with a second doping concentration formed on the first epitaxial layer; and
   a third epitaxial layer with a third doping concentration formed on the second epitaxial layer,
   wherein the first doping concentration and the third doping concentration are greater than the second doping concentration.

3. The transistor structure according to claim 2, wherein:
   the first doping concentration is in a range of approximately 1e18 atom/cm$^3$-8e19 atom/cm$^3$;
   the second doping concentration is in a range of approximately 5e15 atom/cm$^3$-8e17 atom/cm$^3$; and
   the third doping concentration is in a range of approximately 1e18 atom/cm$^3$-8e19 atom/cm$^3$.

4. The transistor structure according to claim 2, wherein:
   a thickness of the first epitaxial layer is in a range of approximately 10 nm-50 nm;
   a thickness of the second epitaxial layer is in a range of approximately 10 μm-20 μm; and
   a thickness of the third epitaxial layer is in a range of approximately 10 nm-50 nm.

5. The transistor structure according to claim 1, wherein: the epitaxial layer is made of a wide band-gap material.

6. The transistor structure according to claim 1, wherein: the epitaxial layer is made of one of SiC and GaN.

7. The transistor structure according to claim 1, wherein: a distance between adjacent trenches is in a range of approximately 1 μm-3 μm.

8. The transistor structure according to claim 1, wherein: a depth of the trenches is 1/10-1/2 of a total thickness of the epitaxial layer.

9. The transistor structure according to claim 1, wherein: a work function difference between the gate electrode layer and the epitaxial layer is greater than approximately 1.5 eV.

10. The transistor structure according to claim 1, wherein: a thickness of the insulation layer is in a range of approximately 50 nm-500 nm.

11. The transistor structure according to claim 9, further comprising:
    a work function film formed between the gate dielectric layer and the gate electrode layer to adjust the work function difference.

* * * * *